US012306271B2

(12) United States Patent
Hou et al.

(10) Patent No.: US 12,306,271 B2
(45) Date of Patent: May 20, 2025

(54) MANUFACTURING METHOD FOR FLUXGATE CHIP

(71) Applicant: NINGBO CRRC TIMES TRANSDUCER TECHNOLOGY CO., LTD., Ningbo (CN)

(72) Inventors: Xiaowei Hou, Ningbo (CN); Yang Lv, Ningbo (CN); Liangguang Zheng, Ningbo (CN); Juping Li, Ningbo (CN); Po Zhang, Ningbo (CN); Peng Wu, Ningbo (CN)

(73) Assignee: NINGBO CRRC TIMES TRANSDUCER TECHNOLOGY CO., LTD., Ningbo (CN)

( * ) Notice: Subject to any disclaimer, the term of this patent is extended or adjusted under 35 U.S.C. 154(b) by 146 days.

(21) Appl. No.: 18/000,846

(22) PCT Filed: Jul. 15, 2020

(86) PCT No.: PCT/CN2020/102007
§ 371 (c)(1),
(2) Date: Dec. 6, 2022

(87) PCT Pub. No.: WO2021/248621
PCT Pub. Date: Dec. 16, 2021

(65) Prior Publication Data
US 2023/0213598 A1    Jul. 6, 2023

(30) Foreign Application Priority Data
Jun. 8, 2020 (CN) .......................... 202010509797.3

(51) Int. Cl.
*G01R 33/00* (2006.01)
*G01R 33/04* (2006.01)
*G01R 33/3873* (2006.01)

(52) U.S. Cl.
CPC ......... *G01R 33/0052* (2013.01); *G01R 33/04* (2013.01); *G01R 33/3873* (2013.01)

(58) Field of Classification Search
CPC .. G01R 1/18; G01R 31/2887; G01R 33/0052; G01R 33/04; G01R 33/3873; H01L 22/12; H01L 23/552
(Continued)

(56) References Cited

U.S. PATENT DOCUMENTS 5,939,881 A * 8/1999 Slater .................... G01R 33/04
324/253
2004/0251897 A1   12/2004 Pedersen
(Continued)

FOREIGN PATENT DOCUMENTS

| CN | 101481080 A | 7/2009 |
| CN | 106291405 A | 1/2017 |

(Continued)

OTHER PUBLICATIONS

International Search Report dated Mar. 15, 2021 from PCT Application No. PCT/CN2020/102007.

*Primary Examiner* — Raul J Rios Russo
*Assistant Examiner* — Trung Q Nguyen
(74) *Attorney, Agent, or Firm* — INNOVATION CAPITAL LAW GROUP, LLP; Vic Lin

(57) ABSTRACT

A manufacturing method for a fluxgate chip, comprising: firstly, selecting two high-resistance silicon wafers, electroplating a ferromagnetic core on the surface of one of the two high-resistance silicon wafers, and providing a ferromagnetic core cavity on the surface of the other high-resistance silicon wafer; then, bonding the two high-resistance silicon wafers up and down; next, respectively providing coil grooves, through grooves and electrode windows on the surfaces of opposite sides of the two high-resistance silicon
(Continued)

wafers to form a silicon wafer mold; and finally, filling the surface of the silicon wafer mold with alloy. By means of electroplating, post-bonding and final etching, on the one hand, the formed fluxgate chip has both small thickness and sufficient strength, on the other hand, large-scale batch production of the fluxgate chip can be achieved, the working efficiency is improved, and the production cost is reduced.

8 Claims, 4 Drawing Sheets

(58) Field of Classification Search
USPC ........ 324/200, 252, 600, 750.27, 76.11, 126, 324/500, 756.05, 538
See application file for complete search history.

(56) References Cited

U.S. PATENT DOCUMENTS

| | | | |
|---|---|---|---|
| 2007/0094861 A1* | 5/2007 | Na | G01R 33/05 29/592.1 |
| 2012/0206134 A1* | 8/2012 | Fischer | G01R 33/091 324/244 |
| 2014/0026661 A1* | 1/2014 | Zhang | G01P 15/125 73/504.12 |
| 2017/0267521 A1* | 9/2017 | Stringer | B81C 1/00825 |

FOREIGN PATENT DOCUMENTS

| | | |
|---|---|---|
| CN | 106772142 A | 5/2017 |
| CN | 107367288 A | 11/2017 |
| CN | 206959858 U | 2/2018 |

* cited by examiner

MANUFACTURING METHOD FOR FLUXGATE CHIP

TECHNICAL FIELD

The invention belongs to the technical field of fluxgate sensors, and relates to a manufacturing method, in particular to a manufacturing method for a fluxgate chip.

DESCRIPTION OF RELATED ART

Traditional fluxgate sensors are manufactured by winding a three-dimensional solenoid coil on a magnetic core of a soft magnetic thin film. Fluxgate sensors manufactured through this method have the defects of large size, large weight, high power consumption, low sensitivity and poor long-term stability, and cannot meet the development requirement for microminiaturization of electronic devices. The MEMS technique for manufacturing chip-sized fluxgate sensors, developed in recent decades, not only can greatly reduce the size and weight of traditional fluxgate sensors, but also can effectively reduce power consumption and improve the long-term stability of the fluxgate sensors.

Existing patent (CN107367288A) discloses a manufacturing method for a micro fluxgate sensor, comprising: selecting two high-resistance silicon wafers, and performing etching on the two high-resistance silicon wafers respectively to form a magnetic core cavity for receiving a magnetic core, multiple solenoid cavities around the periphery of the magnetic core cavity, and electrode windows communicated with the solenoid cavities after the two high-resistance silicon wafers are bonded; filling the solenoid cavities with coil materials to form solenoid coils in the solenoid cavities; cutting the two bonded high-resistance silicon wafers from the middle of the magnetic core cavity to form an opening in one side of the magnetic core cavity, inserting a magnetic core into the magnetic core cavity from the opening, and filling the opening with filling materials, such that a micro fluxgate sensor is manufactured. According to the manufacturing method for the micro fluxgate sensor, the manufacturing process of the solenoid coils is simple, the micro-electroplating process is avoided, environmental pollution is reduced, and the cost is reduced. The arrangement manner of the magnetic core avoids damage to the soft magnetic properties of the magnetic core and improves the performance of the magnetic core.

However, the manufacturing method for the micro fluxgate sensor manufactures the micro fluxgate sensor through etching, then bonding and finally magnetic core insertion, which has the following problems: first, bonding is performed after etching, so the finally obtained chip has a large thickness; and second, the magnetic core needs to be manually inserted, so the efficiency is low.

BRIEF SUMMARY OF THE INVENTION

The objective of the invention is to overcome the aforementioned problems of the prior art by providing a manufacturing method, which can reduce the thickness of a chip and realize large-scale batch production, and has high working efficiency.

The objective of the invention may be fulfilled through the following technical solution: a manufacturing method for a fluxgate chip, comprising:

Step 1: selecting two high-resistance silicon wafers, electroplating a ferromagnetic core on a first surface of one of the two high-resistance silicon wafers, and performing etching on a first surface of the other high-resistance silicon wafer to form a ferromagnetic core cavity;

Step 2: bonding the high-resistance silicon wafer electroplated with the ferromagnetic core and the high-resistance silicon wafer provided with the ferromagnetic core cavity up and down to enable the ferromagnetic core to be inlaid in the ferromagnetic core cavity;

Step 3: performing oxidation treatment on a second surface of the high-resistance silicon wafer electroplated with the ferromagnetic core and a second surface of the high-resistance silicon wafer provided with the ferromagnetic core cavity to form insulating layers by deposition;

Step 4: etching multiple first coil grooves across the ferromagnetic core, and an independent first electrode window on the second surface of the high-resistance silicon wafer electroplated with the ferromagnetic core;

Step 5: in a thickness direction of the high-resistance silicon wafer electroplated with the ferromagnetic core, etching first through grooves communicated with the corresponding first coil grooves in two ends of each first coil groove respectively;

Step 6: turning the two bonded high-resistance silicon wafers up and down;

Step 7: etching multiple second coil grooves across the ferromagnetic core cavity, and an independent second electrode window on the second surface of the high-resistance silicon wafer provided with the ferromagnetic core cavity;

Step 8: in a thickness direction of the high-resistance silicon wafer provided with the ferromagnetic core cavity, etching second through grooves communicated with the corresponding second coil grooves in two ends of each second coil groove respectively, to form a silicon wafer mold, wherein an annular cavity is formed in a surface of the silicon wafer mold;

Step 9: performing oxidation treatment on surfaces of the first coil grooves, the first through grooves, the first electrode window, the second coil grooves, the second through grooves and the second electrode window to form insulating layers by deposition; and Step 10: filling the annular cavity of the silicon wafer mold with alloy, such that a fluxgate chip is manufactured.

According to the manufacturing method for a fluxgate chip, in Step 1, a cross-sectional area of the ferromagnetic core cavity is greater than that of the ferromagnetic core.

According to the manufacturing method for a fluxgate chip, in Step 2, the high-resistance silicon wafer electroplated with the ferromagnetic core and the high-resistance silicon wafer provided with the ferromagnetic core cavity are bonded up and down through a polymer film.

According to the manufacturing method for a fluxgate chip, every two adjacent first coil grooves are arranged at equal intervals in Step 4, and every two adjacent second coil grooves are arranged at equal intervals in Step 7.

According to the manufacturing method for a fluxgate chip, the first coil grooves, the first through grooves, the second coil grooves and the second through grooves in corresponding positions are connected end to end to form the annular cavity.

According to the manufacturing method for a fluxgate chip, the first electrode window corresponds to the second electrode window in position, wherein the first electrode window and the second electrode window are vertically communicated and are coaxial with each other.

According to the manufacturing method for a fluxgate chip, the oxidation treatment in Step 9 is thermal oxidation or PECVD.

According to the manufacturing method for a fluxgate chip, the etching in Step 1, Step 4, Step 5 and Step 7 is performed with KOH or TMAH, or through DRIE.

Compared with the prior art, the manufacturing method for a fluxgate chip has the following beneficial effects: by means of electroplating, post-bonding and final etching, on the one hand, the formed fluxgate chip has a small thickness and sufficient strength, on the other hand, large-scale batch production of the fluxgate chip can be achieved, the working efficiency is improved, and the production cost is reduced.

In the figures: 100, high-resistance silicon wafer; 110, first surface; 120, ferromagnetic core cavity; 130, second surface; 140, first coil groove; 150, first electrode window; 160, first through groove; 170, second coil groove; 180, second electrode window; 190, second through groove; 200, ferromagnetic core; 300, insulating layer; 400, alloy.

DETAILED DESCRIPTION OF THE INVENTION

The technical solution of the invention will be further described below in conjunction with the following specific embodiments and drawings, but the invention is not limited to these embodiments.

Figure 1:
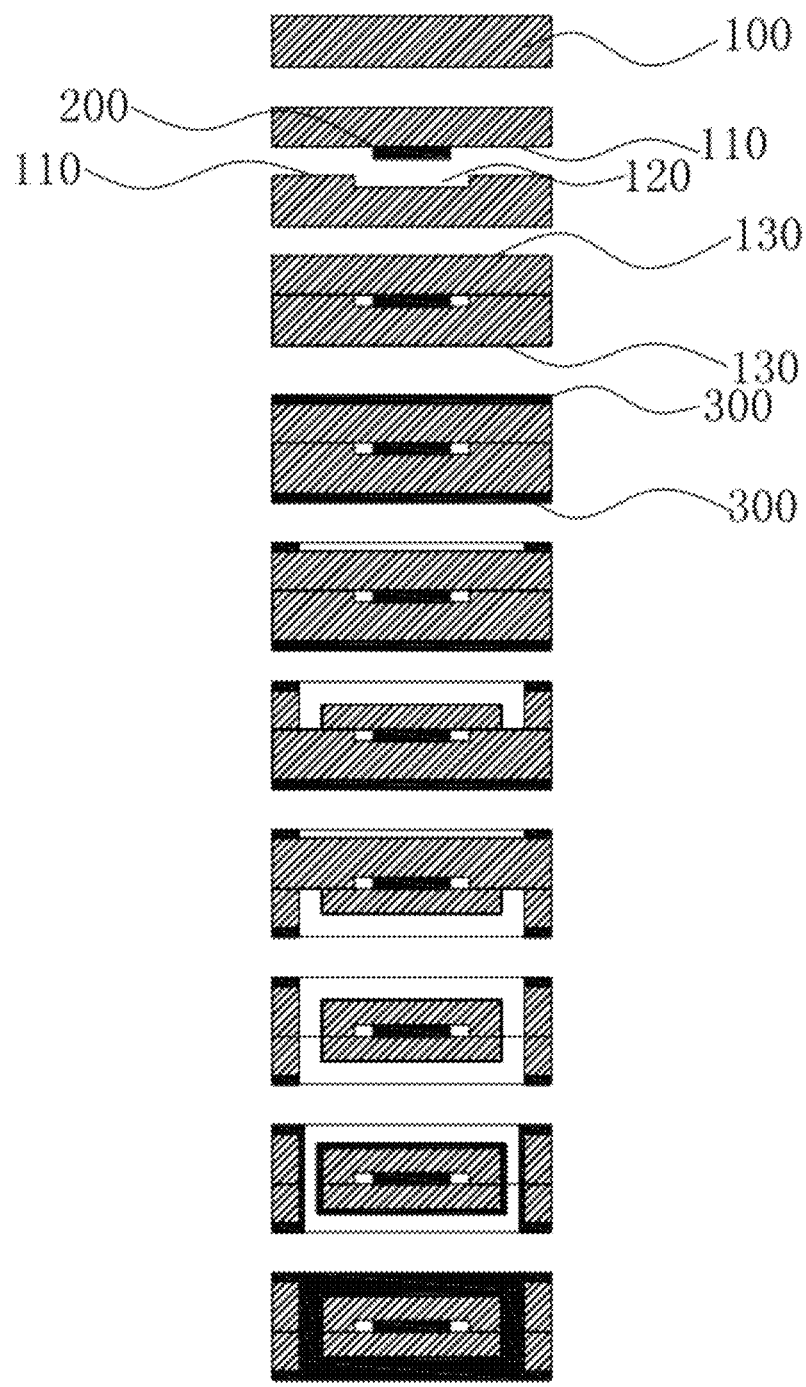
FIG. 1 is a front view of an internal structure in corresponding steps of a manufacturing method for a fluxgate chip according to the invention.
Figure 2:
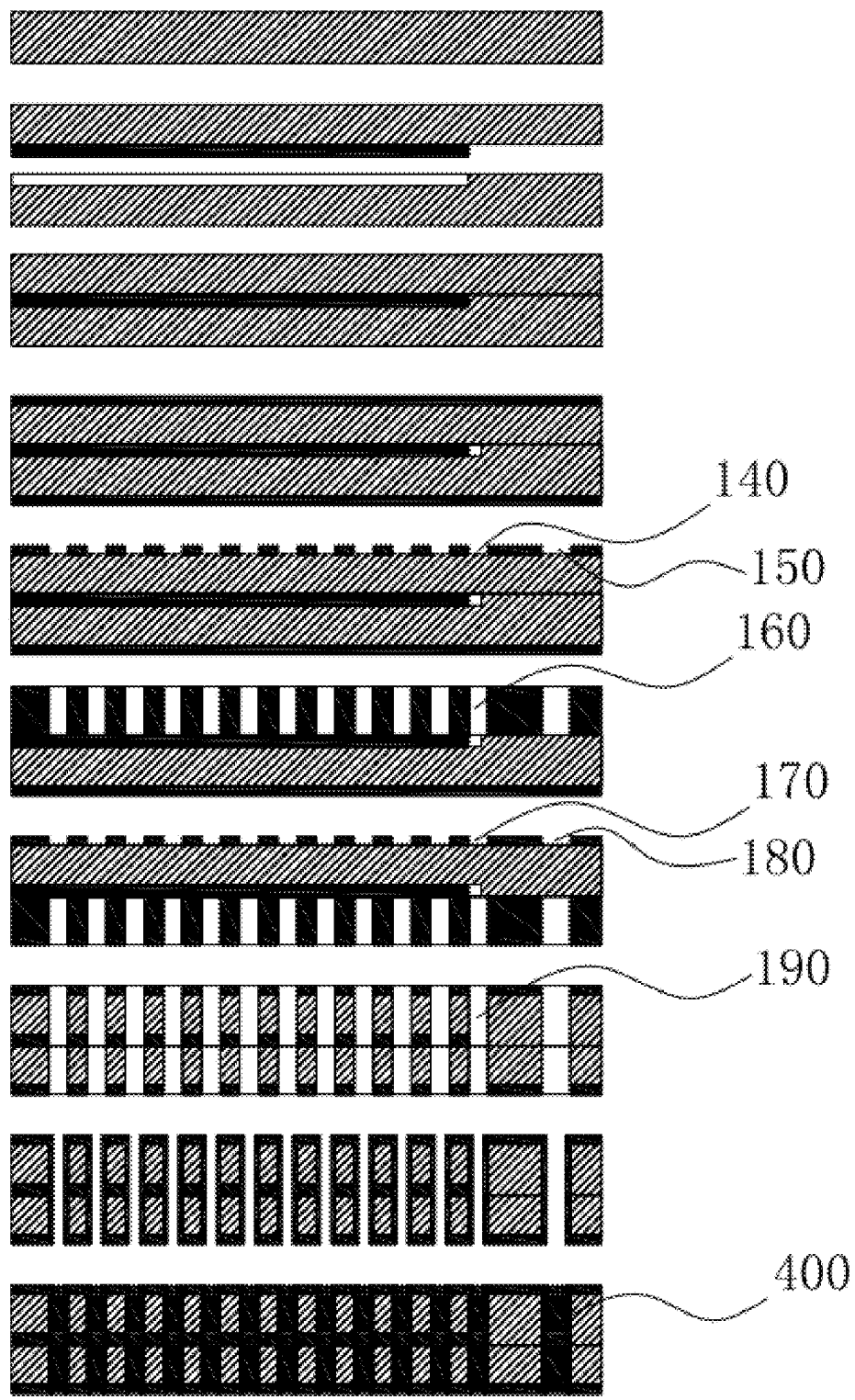
FIG. 2 is a side view of the internal structure in corresponding steps of the manufacturing method for a fluxgate chip according to the invention.
Figure 3:
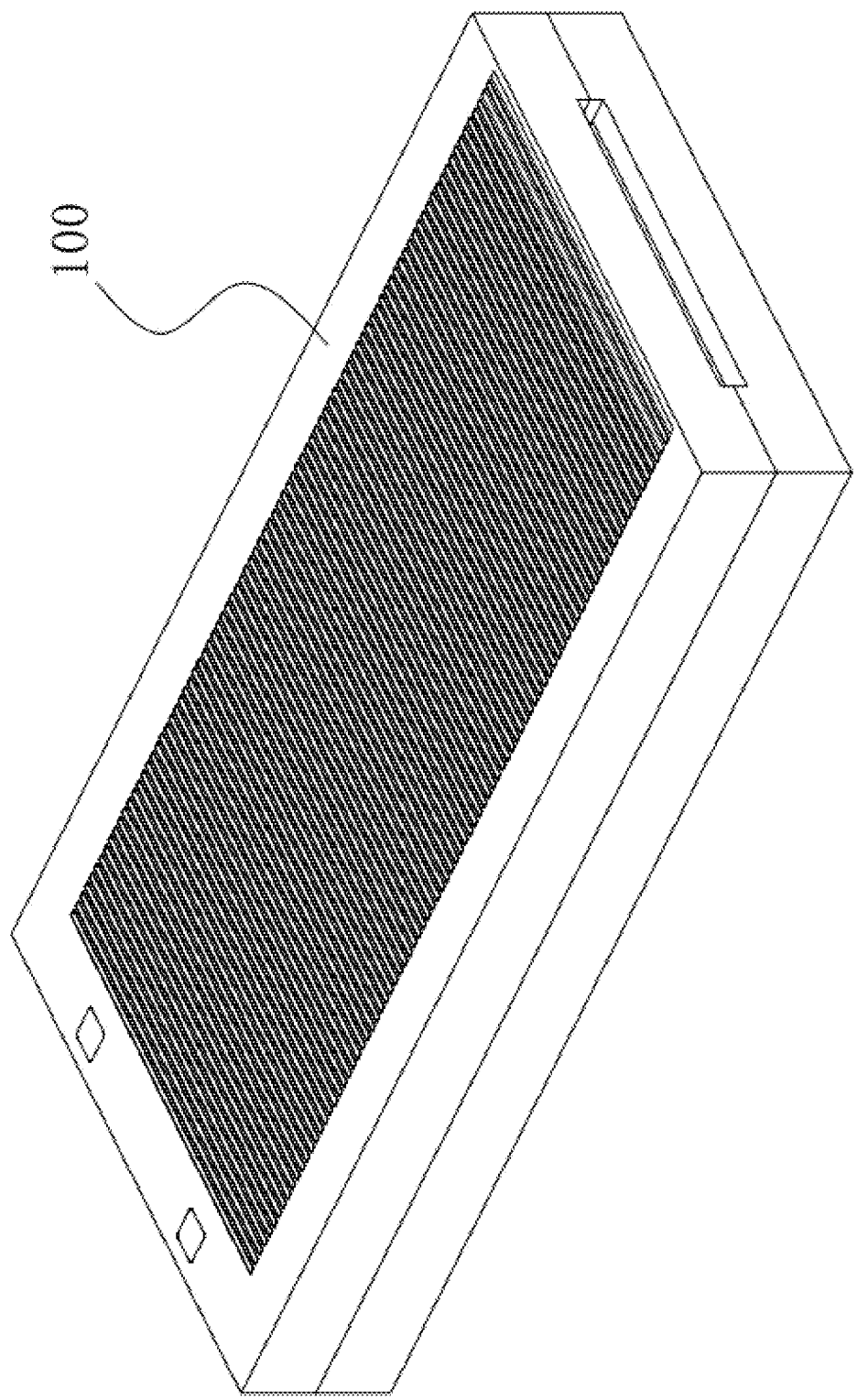
FIG. 3 is a structural view of a silicon wafer mold used for the manufacturing method for a fluxgate chip according to the invention.
Figure 4:
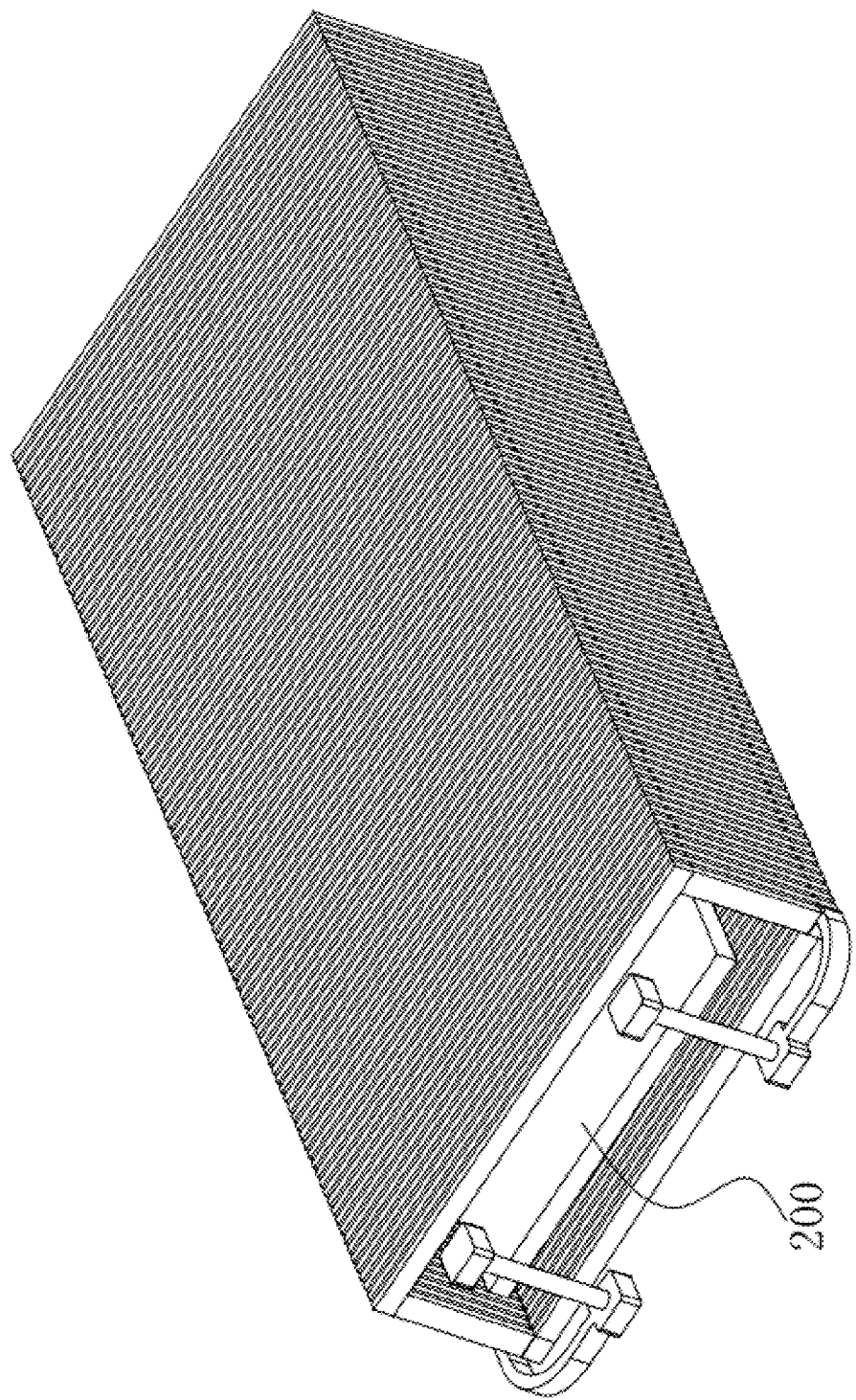
FIG. 4 is a partial structural view of the silicon wafer mold used for the manufacturing method for a fluxgate chip according to the invention.

As shown in FIG. 1 to FIG. 4, the invention provides a manufacturing method for a fluxgate chip, comprising: Step 1, two high-resistance silicon wafers 100 are selected, a ferromagnetic core 200 is electroplated on a first surface 110 of one of the two high-resistance silicon wafers 100; and etching is performed on a first surface 110 of the other high-resistance silicon wafer 100 to form a ferromagnetic core cavity 120.

Further preferably, the cross-sectional area of the ferromagnetic core cavity 120 is greater than that of the ferromagnetic core 200, such that the ferromagnetic core 200 can be easily inserted into the ferromagnetic core cavity 120, and the surfaces of the two high-resistance silicon wafers 100 are made flat and smooth.

Step 2, the high-resistance silicon wafer 100 electroplated with the ferromagnetic core 200 and the high-resistance silicon wafer 100 provided with the ferromagnetic core cavity 120 are bonded up and down to enable the ferromagnetic core 200 to be inlaid in the ferromagnetic core cavity 120.

In this embodiment, after the two high-resistance silicon wafers 100 are bonded in Step 2, the ferromagnetic core 200 is located in the ferromagnetic core cavity 120, so compared with the prior art that the ferromagnetic core 200 is inserted manually, large-scale batch production can be realized, and the corresponding working efficiency is guaranteed. In addition, in this embodiment, the two high-resistance silicon wafers 100 are bonded up and down through a polymer film. Wherein, the polymer film is made of BCB or polyimide (PI).

Step 3, oxidation treatment is performed on a second surface 130 (opposite to the first surface 110) of the high-resistance silicon wafer 100 electroplated with the ferromagnetic core 200 and a second surface 130 (opposite to the first surface 110) of the high-resistance silicon wafer 100 provided with the ferromagnetic core cavity 120 to form insulating layers 300 by deposition.

Step 4, multiple first coil grooves 140 across the ferromagnetic core 200, and an independent first electrode window 150 are etched on the second surface 130 of the high-resistance silicon wafer 100 electroplated with the ferromagnetic core 200.

In this embodiment, every two adjacent first coil grooves 140 are arranged at equal intervals.

Step 5, in a thickness direction of the high-resistance silicon wafer 100 electroplated with the ferromagnetic core 200, first through grooves 160 communicated with the corresponding first coil grooves 140 are etched in two ends of each first coil groove 140 respectively.

Step 6, the two bonded high-resistance silicon wafers 100 are turned up and down, such that the second surface 130 of the high-resistance silicon wafer 100 provided with the ferromagnetic core cavity 120 faces upwards, and the second surface 130 of the high-resistance silicon wafer 100 electroplated with the ferromagnetic core 200 faces downwards.

Step 7, multiple second coil grooves 170 across the ferromagnetic core cavity 120, and an independent second electrode window 180 are etched on the second surface 130 of the high-resistance silicon wafer 100 provided with the ferromagnetic core cavity 120;

Step 8, in a thickness direction of the high-resistance silicon wafer 100 provided with the ferromagnetic core cavity 120, second through grooves 190 communicated with the corresponding second coil grooves 170 are etched in two ends of each second coil groove 170 respectively to form a silicon wafer mold.

In this embodiment, every two adjacent second coil grooves 170 are arranged at equal intervals. Wherein, the position of each second coil groove 170 corresponds to the position of each first coil groove 140, the second through grooves 190 are vertically communicated with the first through grooves 160 and are coaxial with each other, and the second electrode window 180 corresponds to the first electrode window 150 in position, and is vertically communicated and coaxial with the first electrode window 150. Wherein, an open direction of the first electrode window 150 is opposite to an open direction of the second electrode window 180, such that an annular cavity is formed in the surface of the two high-resistance silicon wafers 100 bonded up and down.

Step 9, performing oxidation treatment on surfaces of the first coil grooves 140, the first through grooves 160, the first electrode window 150, the second coil grooves 170, the second through grooves 190 and the second electrode window 180 to form insulating layers 300 by deposition;

Step 10, the annular cavity is filled with alloy 400 to form a solenoid coil. The forming time can be shortened, and the yield can be increased.

In this embodiment, the oxidization treatment may adopt thermal oxidation or PECVD (plasma-enhanced chemical-vapor deposition) to form silicon dioxide insulating layers 300. KOH (potassium hydroxide) or TMAH (tetramethylammonium hydroxide) is used for etching, or DRIE (deep reactive ion etching) is used for etching.

According to the manufacturing method for a fluxgate chip, by means of electroplating, post-bonding and final etching, on the one hand, the formed fluxgate chip has a small thickness and sufficient strength, on the other hand, large-scale batch production of the fluxgate chip can be achieved, the working efficiency is improved, and the production cost is reduced.

The specific embodiments described above are merely used for explaining the spirit of the invention by way of examples. Those skilled in the art can make various transformations, supplements or similar substitutions to these specific embodiments without deviating from the spirit of the invention or exceeding the scope defined by the appended claims.

What is claimed is:

1. A manufacturing method for a fluxgate chip, comprising:
   Step 1: selecting two high-resistance silicon wafers, electroplating a ferromagnetic core on a first surface of one of the two high-resistance silicon wafers, and performing etching on a first surface of the other high-resistance silicon wafer to form a ferromagnetic core cavity;
   Step 2: bonding the high-resistance silicon wafer electroplated with the ferromagnetic core and the high-resistance silicon wafer with the ferromagnetic core cavity up and down to enable the ferromagnetic core to be inlaid in the ferromagnetic core cavity;
   Step 3: performing oxidation treatment on a second surface of the high-resistance silicon wafer electroplated with the ferromagnetic core and a second surface of the high-resistance silicon wafer with the ferromagnetic core cavity to form insulating layers by deposition;
   Step 4: etching multiple first coil grooves which crossing the ferromagnetic core and an independent first electrode window on the second surface of the high-resistance silicon wafer electroplated with the ferromagnetic core;
   Step 5: in a thickness direction of the high-resistance silicon wafer electroplated with the ferromagnetic core, etching first through grooves communicated with the corresponding first coil grooves in two ends of each said first coil groove respectively;
   Step 6: turning the two bonded high-resistance silicon wafers up and down;
   Step 7: etching multiple second coil grooves which crossing the ferromagnetic core cavity and an independent second electrode window on the second surface of the high-resistance silicon wafer with the ferromagnetic core cavity;
   Step 8: in a thickness direction of the high-resistance silicon wafer with the ferromagnetic core cavity, etching second through grooves communicated with the corresponding second coil grooves in two ends of each said second coil groove respectively, wherein the position of each second coil groove corresponds to the position of each first coil groove, the second through grooves are vertically communicated with the first through grooves and are coaxial with each other, such that an annular cavity is formed in the surface of the two high-resistance silicon wafers bonded up and down;
   Step 9: performing oxidation treatment on surfaces of the first coil grooves, the first through grooves, the first electrode window, the second coil grooves, the second through grooves and the second electrode window to form insulating layers by deposition; and
   Step 10: filling the annular cavity of the silicon wafer mold with alloy to form a solenoid coil, such that a fluxgate chip is manufactured.

2. The manufacturing method for a fluxgate chip according to claim 1, wherein in Step 1, a cross-sectional area of the ferromagnetic core cavity is greater than that of the ferromagnetic core.

3. The manufacturing method for a fluxgate chip according to claim 1, wherein in Step 2, the high-resistance silicon wafer electroplated with the ferromagnetic core and the high-resistance silicon wafer provided with the ferromagnetic core cavity are bonded up and down through a polymer film.

4. The manufacturing method for a fluxgate chip according to claim 1, wherein every two adjacent said first coil grooves are arranged at equal intervals in Step 4, and every two adjacent said second coil grooves are arranged at equal intervals in Step 7.

5. The manufacturing method for a fluxgate chip according to claim 4, wherein the first coil grooves, the first through grooves, the second coil grooves and the second through grooves in corresponding positions are connected end to end to form the annular cavity.

6. The manufacturing method for a fluxgate chip according to claim 4, wherein the first electrode window corresponds to the second electrode window in position, wherein the first electrode window and the second electrode window are vertically communicated and are coaxial with each other.

7. The manufacturing method for a fluxgate chip according to claim 1, wherein the oxidation treatment in Step 9 is thermal oxidation or PECVD.

8. The manufacturing method for a fluxgate chip according to claim 1, wherein the etching in Step 1, Step 4, Step 5, Step 7 and Step 8 is performed with KOH or TMAH, or through DRIE.

* * * * *